United States Patent [19]
Widmayer et al.

[11] Patent Number: 5,761,042
[45] Date of Patent: Jun. 2, 1998

[54] RADIO FREQUENCY COMPATIBLE MULTI-BOARD CLUSTER

[75] Inventors: Robert Brian Widmayer, Harvard, Ill.; Joachim Haupt, Taunustein; Peter Berthold, Waldems, both of Germany; Cynthia Benske, Gurnee, Ill.

[73] Assignee: Motorola, Inc., Schaumburg, Ill.

[21] Appl. No.: 724,938

[22] Filed: Oct. 2, 1996

[51] Int. Cl.⁶ .............................. H05K 7/20; H05K 9/00
[52] U.S. Cl. .................. 361/704; 174/35 R; 174/35 GC; 361/716; 361/735; 361/816; 361/825
[58] Field of Search .................... 174/35 R, 35 GC; 361/688, 690, 704, 710, 715–716, 733–736, 744, 816, 818, 825

[56] References Cited

U.S. PATENT DOCUMENTS

| | | | |
|---|---|---|---|
| 3,364,395 | 1/1968 | Donofrio et al. | 361/731 |
| 4,227,094 | 10/1980 | Semur et al. | 361/733 |
| 4,316,236 | 2/1982 | Lechner et al. | 361/730 |
| 4,479,263 | 10/1984 | Rosenfeldt et al. | 361/732 |
| 4,858,070 | 8/1989 | Buron et al. | 361/816 |
| 5,461,542 | 10/1995 | Kosak et al. | 361/716 |

*Primary Examiner*—Gregory D. Thompson
*Attorney, Agent, or Firm*—Susan L. Lukasik

[57] ABSTRACT

A radio frequency compatible multi-board cluster (300) having three shielded housings (301, 301, 303) for containing three component parts of a radio, namely, the controller, the transmitter, and the receiver. These shielded housings (301, 301, 303) are electrically and physically intercoupled with one another at 90° angles to form a bracket-receiving cavity (401) there between.

20 Claims, 4 Drawing Sheets

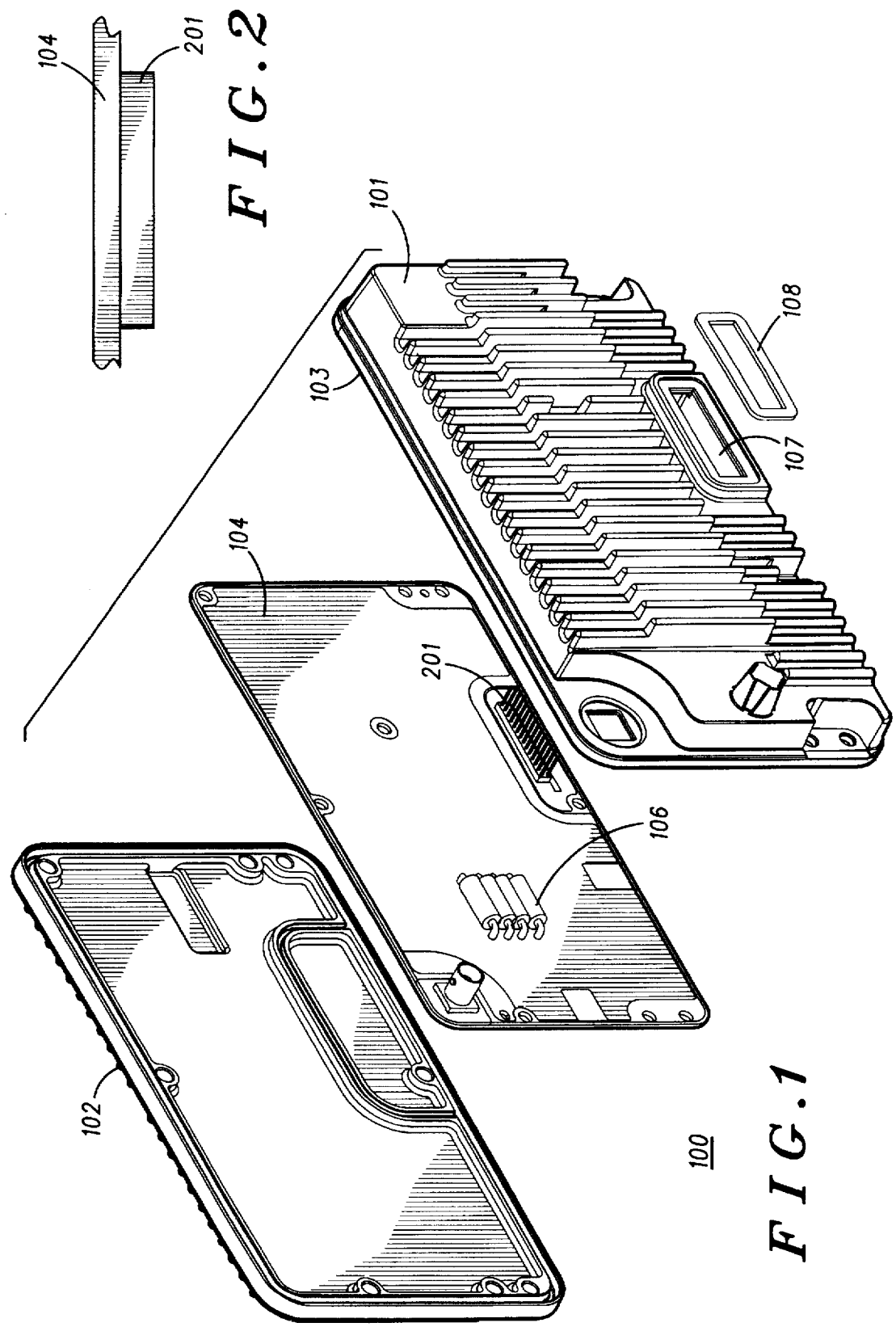

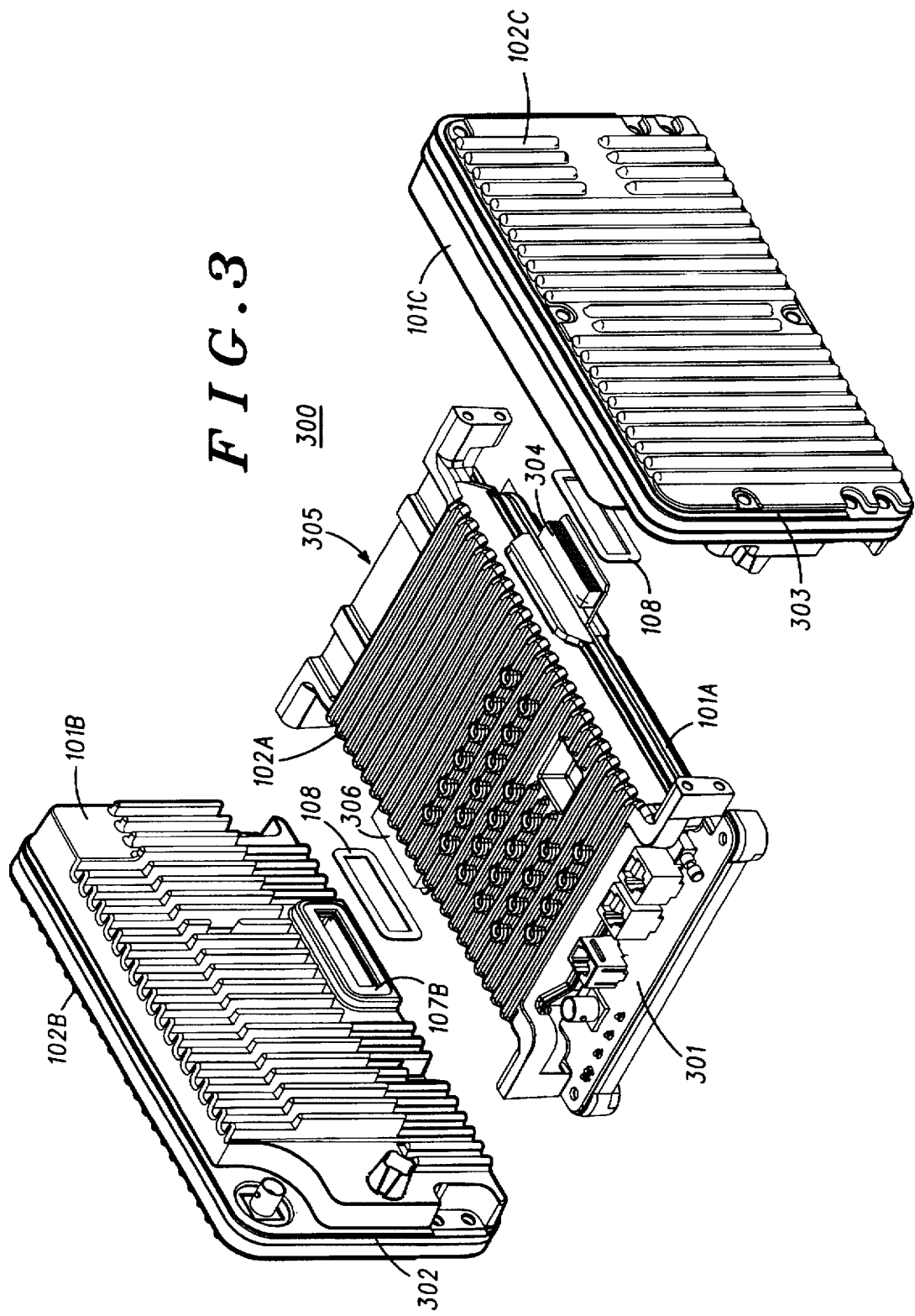

RADIO FREQUENCY COMPATIBLE MULTI-BOARD CLUSTER

FIELD OF THE INVENTION

This invention generally relates to two-way radios.

BACKGROUND OF THE INVENTION

Two-way radios are well known in the art. Many radio communication systems utilize fixed-position transceivers to facilitate communications to, from, and within a group of movable radios. These fixed position transceivers are typically mounted in racks, which racks are located near one or more antennas. Such transceivers typically require appropriate placement in order to protect them from stressful environmental conditions, vandalism, and so forth. At the same time, suitable containment facilities for such transceivers are often at a premium in terms of facilities size and/or cost. Consequently, there is a significant need for relatively small transceivers to thereby minimize the amount of room that is required to so house them.

A typical small prior art transceiver requires at least five rack unit spaces in a typical rack. A communications system requiring twenty transceivers therefore will typically require a considerable number of racks in order to house all of the transceivers and other related systems equipment. These prior art transceivers are typically comprised of multiple boards that serve the various functions of the radio. The fixed site radios themselves often resemble a card cage that accommodates vertical cards or horizontal cards. In some instances, a large single board may support all of the radio functionality. With any of these prior art approaches, a significant amount of rack space is required to suitably accommodate the radio.

Weight of the radio also presents something of an issue. A radio weighing more than 40 pounds will typically require more than one person to transport it. This requirement can be particularly troublesome and inconvenient when repairs are required at a remote site.

A need therefore exists for a radio transceiver that is both relatively light in weight and uses considerably less space in a rack while providing similar or better performance characteristics as compared to prior art radios.

BRIEF DESCRIPTION OF THE DRAWINGS

FIG. 1 is a diagram showing the component parts of a shielded housing in accordance with the invention.

FIG. 2 is a diagram showing a side view of a printed circuit board having a socket in accordance with the invention.

FIG. 3 is a diagram showing three shielded housings in relation to one another in accordance with the invention.

DESCRIPTION OF A PREFERRED EMBODIMENT

Figure 4:
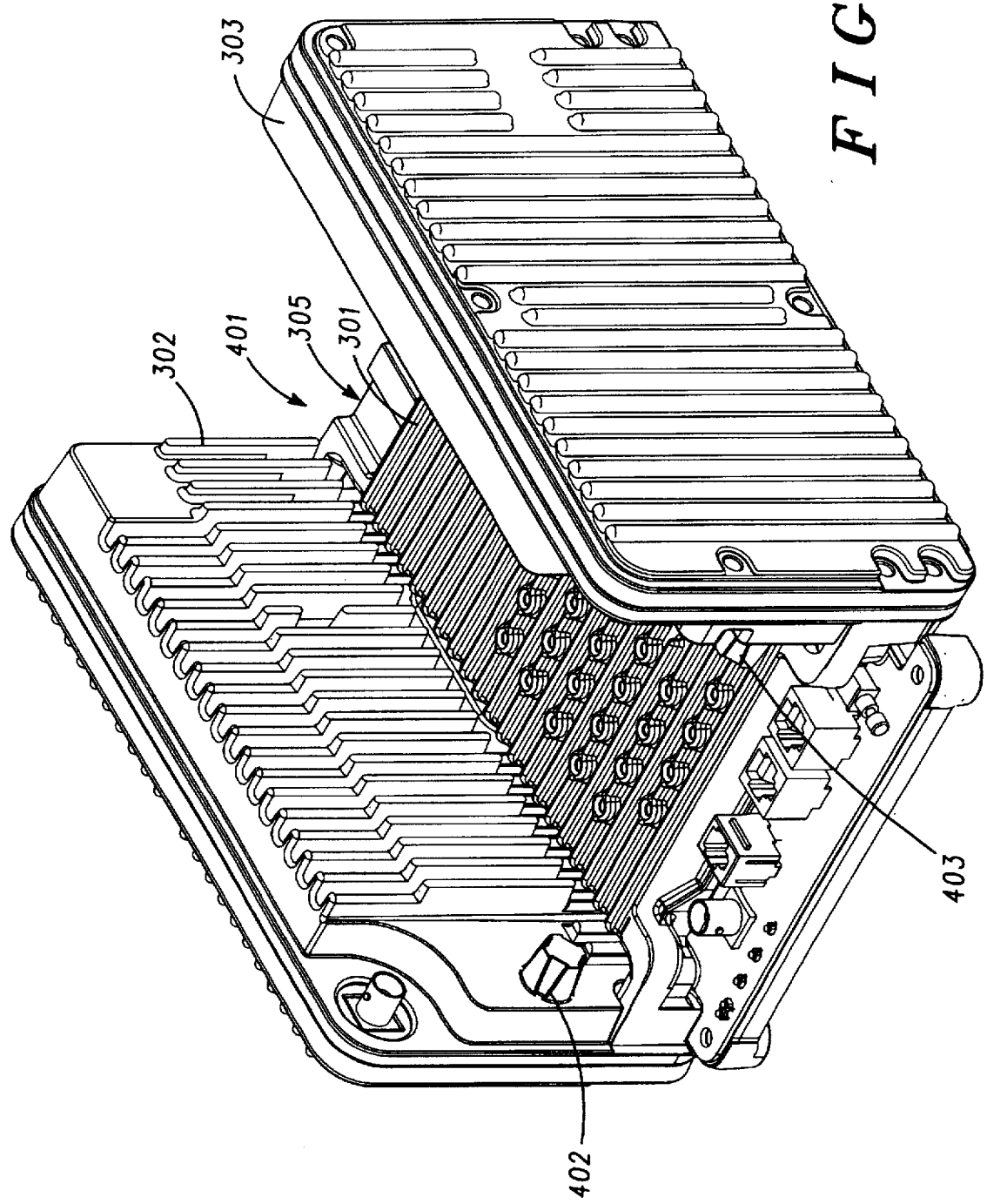
FIG. 4 is a diagram showing a radio frequency compatible multi-board cluster having a bracket-receiving cavity in accordance with the invention.

The following describes an apparatus for and method of constructing a radio frequency compatible multi-board cluster. The multi-board cluster is comprised of three shielded housings, coupled at a 90 degree angle, so as to provide the desired radio frequency transceiver in a relatively light-weight package that uses less space in a rack. Radio frequency performance and other performance characteristics do not suffer due to the arrangement described herein.

A device comprises a first shielded housing having at least one electrical circuit contained therein, the first shielded housing having an first opening and the electrical circuit having a first socket disposed within the first opening, and a second shielded housing having at least one electrical circuit contained therein, the second shielded housing having a second opening and the electrical circuit having a second socket disposed within the second opening. The device also comprises a third shielded housing having at least one electrical circuit contained therein, the third shielded housing having a third, fourth, and fifth opening and the electrical circuit having a third socket disposed within the third opening, a fourth socket disposed within the fourth opening, and a fifth socket disposed within the fifth opening, wherein the first socket is coupled to the third socket, and the second socket is coupled to the fourth socket.

Options providing further advantage to the device are as follows. The first shielded housing and/or the second shielded housing may be disposed at a substantially 90 degree angle with respect to the third shielded housing. The device may further comprise a first gasket disposed about at least a part of the first socket and a second gasket disposed about at least a part of the second socket. The first gasket may also be disposed about at least a part of the third socket and the second gasket may also be disposed about at least a part of the fourth socket. The first, second, and third shielded housings may be disposed with respect to one another to form a bracket-receiving cavity. An electrical circuit supported by a bracket that is disposed within the bracket-receiving cavity may be electrically coupleable to the fifth socket. The first shielded housing may further have a heat sink formed on at least one surface or at least two surfaces thereof, and the two surfaces may be on opposite sides of the first shielded housing. The second shielded housing may further have a heat sink formed on at least one surface or at least two surfaces thereof, and the two surfaces may be on opposite sides of the second shielded housing. The third shielded housing may further have a heat sink formed on at least one surface thereof.

An alternative configuration of the device comprises a first shielded housing having at least one electrical circuit contained therein and a heat sink formed on at least two surfaces thereof, the first shielded housing having an first opening and the electrical circuit having a first socket disposed within the first opening; a second shielded housing having at least one electrical circuit contained therein and a heat sink formed on at least two surfaces thereof, the second shielded housing having a second opening and the electrical circuit having a second socket disposed within the second opening; and a third shielded housing having at least one electrical circuit contained therein and a heat sink formed on at least one surface thereof, the third shielded housing having a third, fourth, and fifth opening and the electrical circuit having a third socket disposed within the third opening, a fourth socket disposed within the fourth opening, and a fifth socket disposed within the fifth opening, wherein the first socket is coupled to the third socket, and the second socket is coupled to the fourth socket; wherein the first shielded housing is disposed at a substantially 90 degree angle with respect to the third shielded housing, and the second shielded housing is disposed at a substantially 90 degree angle with respect to the third shielded housing.

The alternative configuration of the device may optionally be configured such that the first, second, and third shielded housings are disposed with respect to one another to form a bracket-receiving cavity. An electrical circuit supported by a bracket that is disposed within the bracket-receiving cavity may be electrically coupleable to the fifth socket. The first shielded housing may further include a handle, and the second shielded housing may further include a handle.

Referring now to the drawings, and in particular to FIG. 1, a representative shielded housing can be seen as generally depicted by reference numeral 100. The shielded housing 100 includes a housing base 101 and a matching cover 102. The housing base 101 and cover 102 are comprised of aluminum in this embodiment, though any material that will provide suitable strength and shielding (as well as appropriate heat sinking capabilities) will serve satisfactorily. The housing base 101 includes a rib 103 that can interact with both the cover 102 and an appropriate elastomeric gasket (not shown) in order to provide an effective radio frequency shield in accordance with well understood prior art. The printed circuit board 104 has an electrical circuit 106 formed thereon in accordance with well understood technique. The printed circuit board 104 nests inside the housing base 101, and the cover 102 is then placed on top the housing base 101 and affixed in place using screws or other appropriate fastening devices.

The printed circuit board 104 has a socket 201 (see FIG. 2) disposed on one side thereof in accordance with well understood prior art technique. This socket 201 provides electrical coupling as appropriate to the electrical circuit 106. The housing base 101 includes a first opening 107 to receive at least part of the first socket. A gasket 108 comprised of elastomeric material is provided to facilitate coupling as described below in more detail.

As depicted, both the housing base 101 and the cover 102 have a heat sink formed on a surface thereof. If desired, only one such surface need be provided with the heat sink, or neither, and, of course, heat sink surfaces could be formed elsewhere as desired.

The above description generally describes shielded housings as are used in accordance with the described invention. Differences will be noted below where appropriate.

Referring now to FIG. 3, a radio frequency compatible multi-board cluster 300 making use of the above shielded housing construction will be described. This cluster 300 includes three shielded housings 301, 302, and 303, wherein each such shielded housing is comprised of a housing base 101A, 101B, and 101C and a cover 102A, 102B, and 102C. Each such shielded housing 301, 302, and 303 includes an electrical circuit therein as earlier described.

One of the shielded housings 301 comprises a controller housing as it contains the controller circuitry for the corresponding radio. The controller housing 301 has two openings on either side thereof to receive corresponding sockets 304 and 306 that allow appropriate coupling to the controller circuitry contained therein. In addition, a third socket 305 provided within the back edge of the controller housing 301 may be used to electrically couple option boards (see reference numeral 502 of FIG. 5) and other circuitry to the control circuitry contained within the controller housing 301. In the preferred embodiment, power input, external signals to and from the radio frequency compatible multi-board cluster 300, and signals to and from the option boards 502 run through the third socket 305. In this particular embodiment, this controller housing 301 has a heat sink surface formed on the upper portion thereof, not on the opposing or lower side. If desired, of course, heat sinks could be formed on the opposing or lower side.

Another of the shielded housings 302 includes the transmitter circuitry, and hence will be referred to as the transmitter housing. The transmitter housing 302 includes an opening 107B and socket as described above to allow the transmitter housing 302 to be electrically and physically intercoupled with the controller housing 301. A gasket 108 is utilized as disclosed above in order to seal and shield this connection.

Similarly, a third shielded housing 303 contains the receiver circuitry and will be referred to as the receiver housing 303. As before, the receiver housing 303 includes an opening and socket to allow interconnection of the receiver housing 303 to the controller housing 301. Again, a gasket 108 is used to seal and shield this intercoupling.

Referring now to FIG. 4, the completed radio frequency compatible multi-board cluster 300 is depicted. The various shielded housings can be secured to one another using screws or other appropriate fastening devices. In this particular embodiment, the transmitter 302 and receiver housings 303 are disposed at a substantially 90° angle (±10°) with respect to the controller housing 301. So configured, the three shielded housings form a bracket-receiving cavity 401.

Figure 5:
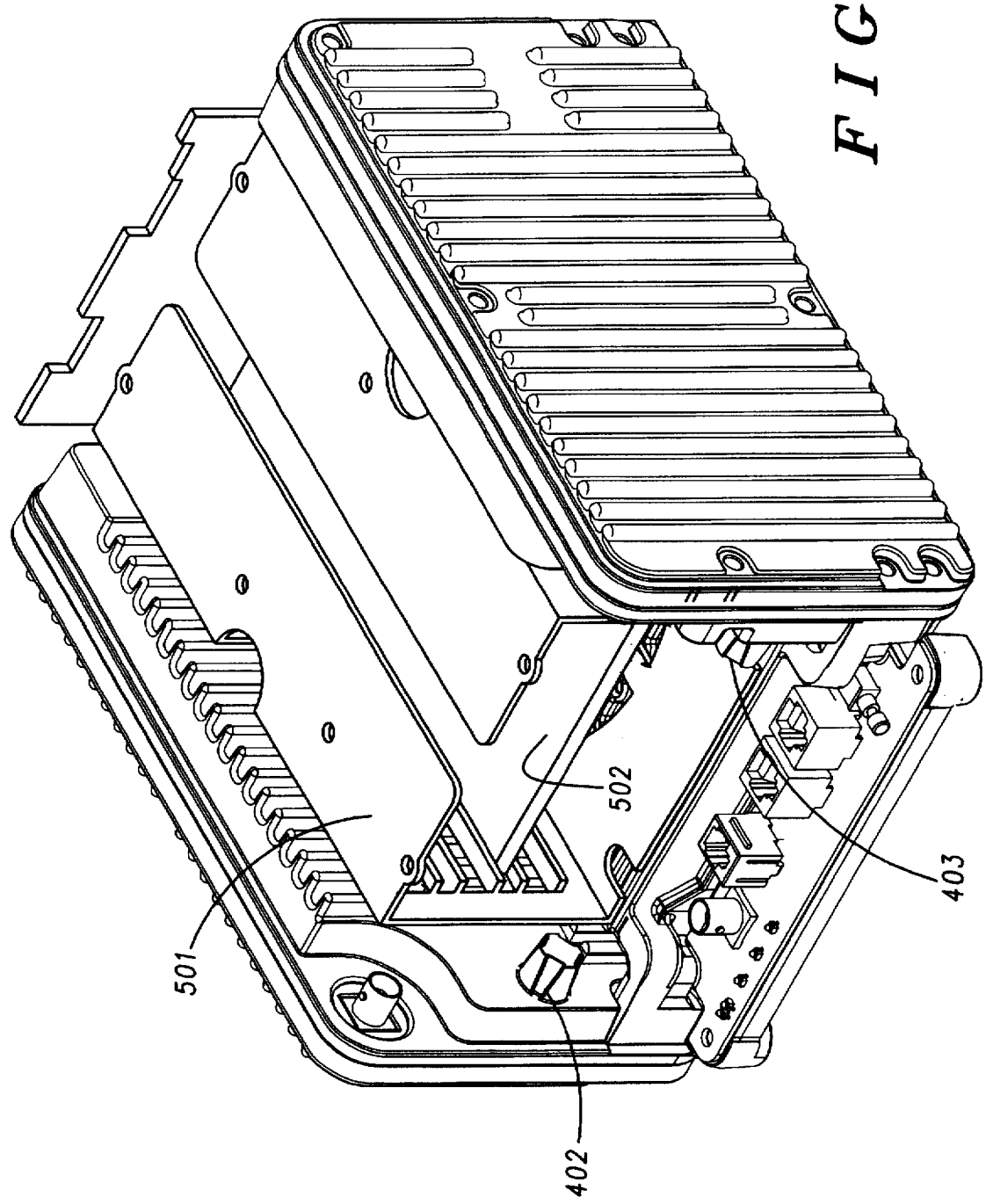
FIG. 5 is a diagram showing a radio frequency compatible multi-board cluster enclosing a bracket and circuit board in accordance with the invention.

As shown in FIG. 5, a bracket 501 can be readily disposed within the bracket-receiving cavity 401 of the radio frequency compatible multi-board cluster 300. In this particular embodiment, such a bracket 501 can support one or more printed circuit boards 502, also referred to as option boards 502, that comprise optional circuitry for use with the radio. Though physically disposed within the bracket-receiving cavity 401, the option boards can be electrically coupled to the control circuitry contained within the controller housing 301 via a third socket 305 provided therewith. The location of the third socket 305 is on the back edge of the controller housing 301. Optionally, the transmitter housing 302 may further include a handle 402 , and the receiver housing 303 may further include a handle 403 for gripping the multi-board cluster 300.

So configured, the resultant radio frequency compatible multi-board cluster is considerably smaller than prior art radios, requiring in this embodiment only three rack units of space. Further, such an embodiment readily supports realization of a considerably lighter radio, in this embodiment weighing less than 40 pounds.

The shielding provided through this embodiment is sufficiently adequate as to support other design alterations that are both beneficial and surprising. For example, unlike prior art radios, a radio back plane can be made free of all radio frequency paths. Instead, all radio frequency routing can be managed within the confines of the cluster itself. This configuration results in a lighter, less expensive, more efficient, and more cost effective radio.

What is claimed is:

1. A device, comprising:
   A) a first shielded housing having at least one electrical circuit contained therein, the first shielded housing having an first opening and the electrical circuit having a first socket disposed within the first opening;
   B) a second shielded housing having at least one electrical circuit contained therein, the second shielded housing having a second opening and the electrical circuit having a second socket disposed within the second opening;
   C) a third shielded housing having at least one electrical circuit contained therein, the third shielded housing having a third, fourth, and fifth opening and the electrical circuit having a third socket disposed within the third opening, a fourth socket disposed within the fourth opening, and a fifth socket disposed within the fifth opening, wherein the first socket is coupled to the third socket, and the second socket is coupled to the fourth socket, wherein the first shielded housing, the second shielded housing, and the third shielded housing are radio frequency shielded, and wherein all radio frequency paths within the device are confined within the first shielded housing, the second shielded housing, and the third shielded housing, and wherein the first shielded housing, the second shielded housing and the third shielded housing substantialy form a U-shape.

2. The device of claim 1, wherein the first shielded housing is disposed at a substantially 90 degree angle with respect to the third shielded housing.

3. The device of claim 1, wherein the second shielded housing is disposed at a substantially 90 degree angle with respect to the third shielded housing.

4. The device of claim 1, wherein the first shielded housing is disposed at a substantially 90 degree angle with respect to the third shielded housing, and the second shielded housing is disposed at a substantially 90 degree angle with respect to the third shielded housing.

5. The device of claim 1, and further comprising:
D) a first gasket disposed about at least a part of the first socket; and
E) a second gasket disposed about at least a part of the second socket.

6. The device of claim 5, wherein: the first gasket is also disposed about at least a part of the third socket; and the second gasket is also disposed about at least a part of the fourth socket.

7. The device of claim 1, wherein the first, second, and third shielded housings are disposed with respect to one another to form a bracket-receiving cavity.

8. The device of claim 7, wherein an electrical circuit supported by a bracket that is disposed within the bracket-receiving cavity is electrically coupleable to the fifth socket, and the electrical circuit supported by the bracket is disposed at a substantially 90 degree angle with respect to the first shielded housing and disposed substantially parallel with respect to the third shielded housing.

9. The device of claim 1, wherein the first shielded housing further has a heat sink formed on at least one surface thereof.

10. The device of claim 1, wherein the first shielded housing further has a heat sink formed on at least two surfaces thereof.

11. The device of claim 10, wherein the two surfaces are on opposite sides of the first shielded housing.

12. The device of claim 1, wherein the second shielded housing further has a heat sink formed on at least one surface thereof.

13. The device of claim 1, wherein the second shielded housing further has a heat sink formed on at least two surfaces thereof.

14. The device of claim 13, wherein the two surfaces are on opposite sides of the second shielded housing.

15. The device of claim 1, wherein the third shielded housing further has a heat sink formed on at least one surface thereof.

16. The device of claim 1, wherein a heat sink is formed on at least the first surface, the second surface, the third surface, the fourth surface, and the fifth surface.

17. A device, comprising:
A) a first shielded housing having at least one electrical circuit contained therein and a heat sink formed on at least two surfaces thereof, the first shielded housing having an first opening and the electrical circuit having a first socket disposed within the first opening, and the first shielded housing having a first surface and a second surface;

B) a second shielded housing having at least one electrical circuit contained therein and a heat sink formed on at least two surfaces thereof, the second shielded housing having a second opening and the electrical circuit having a second socket disposed within the second opening, and the second shielded housing having a third surface and a fourth surface;

C) a third shielded housing having at least one electrical circuit contained therein and a heat sink formed on at least one surface thereof, the third shielded housing having a third, fourth, and fifth opening and the electrical circuit having a third socket disposed within the third opening, a fourth socket disposed within the fourth opening, and a fifth socket disposed within the fifth opening, and the third shielded housing having a fifth surface and a sixth surface, wherein the first socket is coupled to the third socket, and the second socket is coupled to the fourth socket;

wherein the first shielded housing is disposed at a substantially 90 degree angle with respect to the third shielded housing, and the second shielded housing is disposed at a substantially 90 degree angle with respect to the third shielded housing;

wherein the first shielded housing, the second shielded housing, and the third shielded housing substantially form a U-shape, and wherein the first surface, the third surface, and the fifth surface form the inner part of the U-shape, and the second surface, the fourth surface, and the sixth surface form the outside part of the U-shape;

wherein the first shielded housing, the second shielded housing, and the third shielded housing are radio frequency shielded; and wherein all radio frequency paths within the device are confined within the first shielded housing, the second shielded housing, and the third shielded housing.

18. The device of claim 17, wherein the first, second, and third shielded housings are disposed with respect to one another to form a bracket-receiving cavity.

19. The device of claim 18, wherein an electrical circuit supported by a bracket that is disposed within the bracket-receiving cavity is electrically coupleable to the fifth socket, and the electrical circuit supported by the bracket does not include any radio frequency paths.

20. The device of claim 17, wherein the first shielded housing further includes a handle, and the second shielded housing further includes a handle.

* * * * *